US008212331B1

(12) United States Patent  (10) Patent No.: US 8,212,331 B1
Kar-Roy et al.  (45) Date of Patent: Jul. 3, 2012

(54) METHOD FOR FABRICATING A BACKSIDE THROUGH-WAFER VIA IN A PROCESSED WAFER AND RELATED STRUCTURE

(75) Inventors: Arjun Kar-Roy, Irvine, CA (US);
Marco Racanelli, Santa Ana, CA (US);
David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 11/787,063

(22) Filed: Apr. 13, 2007

Related U.S. Application Data

(60) Provisional application No. 60/848,973, filed on Oct. 2, 2006.

(51) Int. Cl.
*H01L 23/52* (2006.01)
*H01L 21/4763* (2006.01)
(52) U.S. Cl. ........ 257/508; 257/774; 257/758; 438/622; 438/700
(58) Field of Classification Search .................. 257/499, 257/508, 758–760, 773–776; 438/128, 460, 438/597, 622, 700; 73/777
See application file for complete search history.

(56) References Cited

U.S. PATENT DOCUMENTS

| | | | | |
|---|---|---|---|---|
| 4,617,730 A * | 10/1986 | Geldermans et al. | ........... | 29/843 |
| 4,791,465 A * | 12/1988 | Sakai et al. | ................... | 257/414 |
| 4,842,699 A * | 6/1989 | Hua et al. | ...................... | 205/126 |
| 5,037,782 A * | 8/1991 | Nakamura et al. | ............. | 438/167 |
| 5,199,298 A * | 4/1993 | Ng et al. | ...................... | 73/54.01 |
| 5,236,854 A * | 8/1993 | Higaki | .......................... | 438/167 |
| 5,336,930 A * | 8/1994 | Quach | .......................... | 257/774 |
| 5,386,142 A * | 1/1995 | Kurtz et al. | .................... | 257/690 |
| 5,511,428 A * | 4/1996 | Goldberg et al. | ............... | 73/777 |
| 5,917,209 A * | 6/1999 | Andoh | .......................... | 257/284 |
| 6,069,068 A * | 5/2000 | Rathore et al. | ............... | 438/628 |
| 6,129,613 A * | 10/2000 | Bothra | .......................... | 451/66 |
| 6,468,889 B1 * | 10/2002 | Iacoponi et al. | ............... | 438/597 |
| 6,485,814 B1 * | 11/2002 | Moriizumi et al. | ........... | 428/210 |
| 6,509,813 B2 * | 1/2003 | Ella et al. | ....................... | 333/187 |
| 6,512,292 B1 * | 1/2003 | Armbrust et al. | ............. | 257/712 |

(Continued)

OTHER PUBLICATIONS

Wu, et al, A High Aspect-Ratio Silicon Substrate-Via Technology and Applications: Through-Wafer Interconnects for Power and Ground and Faraday Cages for SOC Isolation, IEDM, 477-480 (2000).

*Primary Examiner* — Ha Tran T Nguyen
*Assistant Examiner* — Jordan Klein
(74) *Attorney, Agent, or Firm* — Farjami & Farjami LLP

(57) ABSTRACT

According to an exemplary embodiment, a method for fabricating a backside through-wafer via in a processed wafer includes forming a through-wafer via opening through a substrate and extending the through-wafer via opening through at least one interlayer dielectric layer situated over the substrate. The method further includes forming a metal layer in the through-wafer via opening, where the metal layer forms an electrical connection to substrate. The metal layer is also in electrical contact with an interconnect metal segment situated above the at least one interlayer dielectric layer. The method further includes performing a thinning process to reduce the substrate to a target thickness before forming the through-wafer via opening. The method further includes forming an electrically conductive passivation layer on the metal layer and over a bottom surface of the substrate, where the electrically conductive passivation layer is in electrical contact with the metal layer and the substrate.

18 Claims, 5 Drawing Sheets

U.S. PATENT DOCUMENTS

| | | | |
|---|---|---|---|
| 6,597,053 B1* | 7/2003 | Anthofer et al. | 257/508 |
| 6,773,952 B2* | 8/2004 | Armbrust et al. | 438/54 |
| 6,960,837 B2* | 11/2005 | Iadanza | 257/774 |
| 7,071,569 B2* | 7/2006 | Ho et al. | 257/778 |
| 7,081,411 B2* | 7/2006 | Elmadjian et al. | 438/700 |
| 7,109,068 B2* | 9/2006 | Akram et al. | 438/128 |
| 7,339,273 B2* | 3/2008 | Kameyama et al. | 257/774 |
| 7,393,758 B2* | 7/2008 | Sridhar et al. | 438/460 |
| 7,508,072 B2* | 3/2009 | Morita et al. | 257/737 |
| 7,582,971 B2* | 9/2009 | Kameyama et al. | 257/774 |
| 7,670,955 B2* | 3/2010 | Kameyama et al. | 438/700 |
| 8,115,317 B2* | 2/2012 | Yamada et al. | 257/774 |
| 2002/0093398 A1* | 7/2002 | Ella et al. | 333/187 |
| 2003/0017650 A1* | 1/2003 | Armbrust et al. | 438/122 |
| 2003/0160293 A1* | 8/2003 | Iadanza | 257/459 |
| 2003/0222354 A1* | 12/2003 | Mastromatteo et al. | 257/774 |
| 2005/0006783 A1* | 1/2005 | Takao | 257/774 |
| 2006/0003566 A1* | 1/2006 | Emesh | 438/597 |
| 2006/0046463 A1* | 3/2006 | Watkins et al. | 438/622 |
| 2006/0180933 A1* | 8/2006 | Kanamori et al. | 257/758 |
| 2007/0032059 A1* | 2/2007 | Hedler et al. | 438/597 |
| 2007/0284602 A1* | 12/2007 | Chitnis et al. | 257/98 |
| 2008/0128848 A1* | 6/2008 | Suzuki et al. | 257/448 |
| 2008/0284041 A1* | 11/2008 | Jang et al. | 257/774 |

* cited by examiner

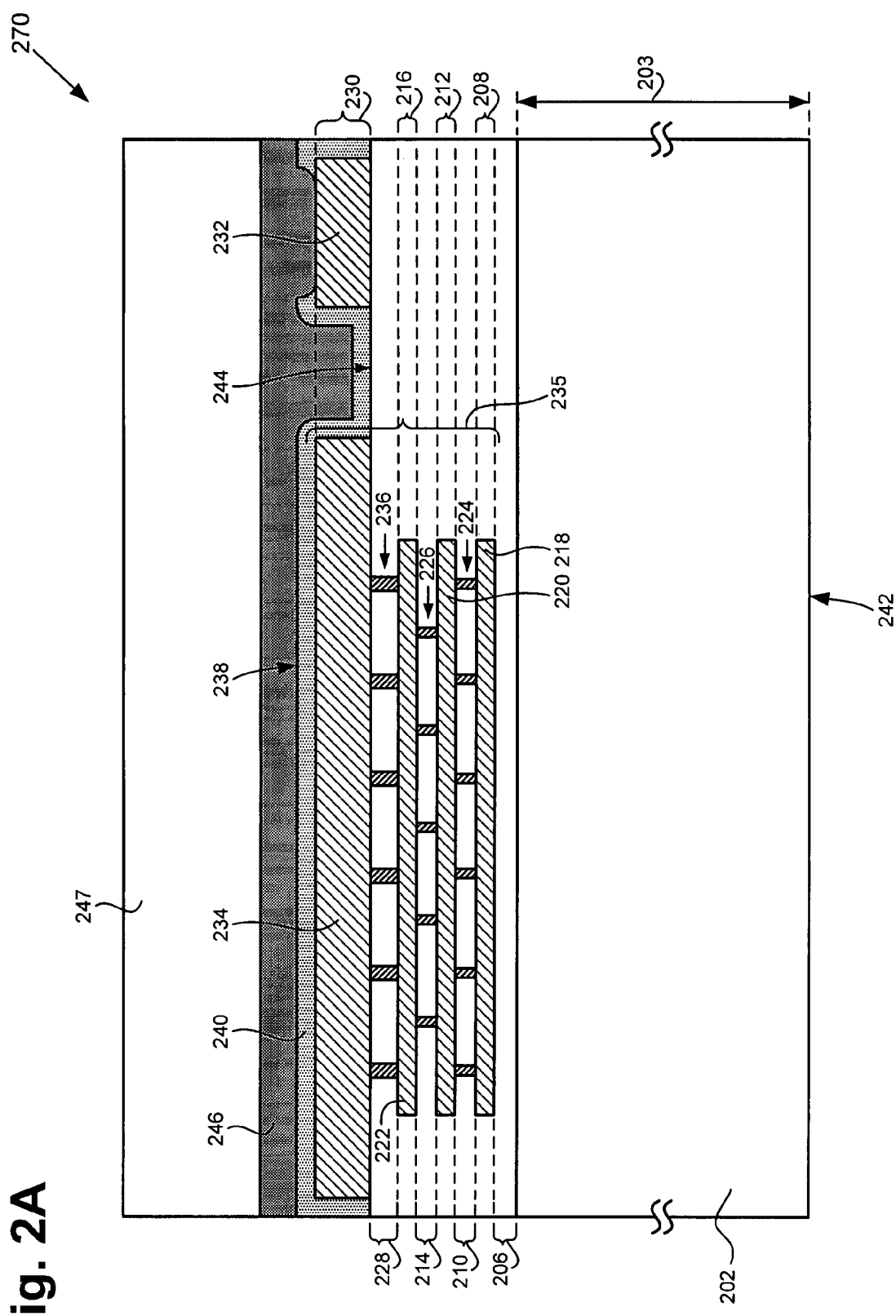

METHOD FOR FABRICATING A BACKSIDE THROUGH-WAFER VIA IN A PROCESSED WAFER AND RELATED STRUCTURE

The present application claims the benefit of and priority to a pending provisional patent application entitled "Method For Fabricating A Backside Through-Wafer Via In A Processed Wafer And Related Structure," Ser. No. 60/848,973 filed on Oct. 2, 2006. The disclosure in that pending provisional application is hereby incorporated fully by reference into the present application.

BACKGROUND OF THE INVENTION

1. Field of the Invention

The present invention is generally in the field of fabrication of semiconductor devices. More particularly, the invention is in the field of fabrication of conductive structures in semiconductor wafers.

2. Background Art

The semiconductor devices, such as bipolar junction transistors (BJTs) and field effect transistors (FETs) that are fabricated using low-cost silicon technology, continue to increase in frequency, speed, and power. As a result, semiconductor devices, such as BJTs and FETs that are fabricated on a silicon wafer, also require conductive structures that provide effective and reduced impedance ground paths for the substrates of these semiconductor devices. For example, an application using silicon-based BJTs can require a conductive structure that provides a reduced impedance path between emitter and ground, while silicon-based FETs can require a conductive structure that provides a lower impedance path between source and ground.

Also, semiconductor devices, such as BJTs and FETs that operate with a high power consumption, require conductive structures that provide more efficient thermal conduits to transfer heat away from the semiconductor device. For example, silicon-based BJTs having increased power-handling capability can require conductive structures that provide more efficient heat transfer to prevent excessive heat from damaging the transistor and/or resulting in degraded device performance.

Thus, there is a need in the art for an effective method for fabricating a conductive structure that provides a reduced impedance ground path for the substrates of semiconductor devices and a more efficient thermal conduit for semiconductor devices.

SUMMARY OF THE INVENTION

A method for fabricating a backside through-wafer via in a processed wafer and related structure, substantially as shown in and/or described in connection with at least one of the figures, as set forth more completely in the claims.

BRIEF DESCRIPTION OF THE DRAWINGS

FIG. 2A illustrates a cross-sectional view, which includes a portion of a wafer processed according to an embodiment of the invention, corresponding to an initial step in the flowchart in FIG. 1.

DETAILED DESCRIPTION OF THE INVENTION

The present invention is directed to a method for fabricating a backside through-wafer via in a processed wafer and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
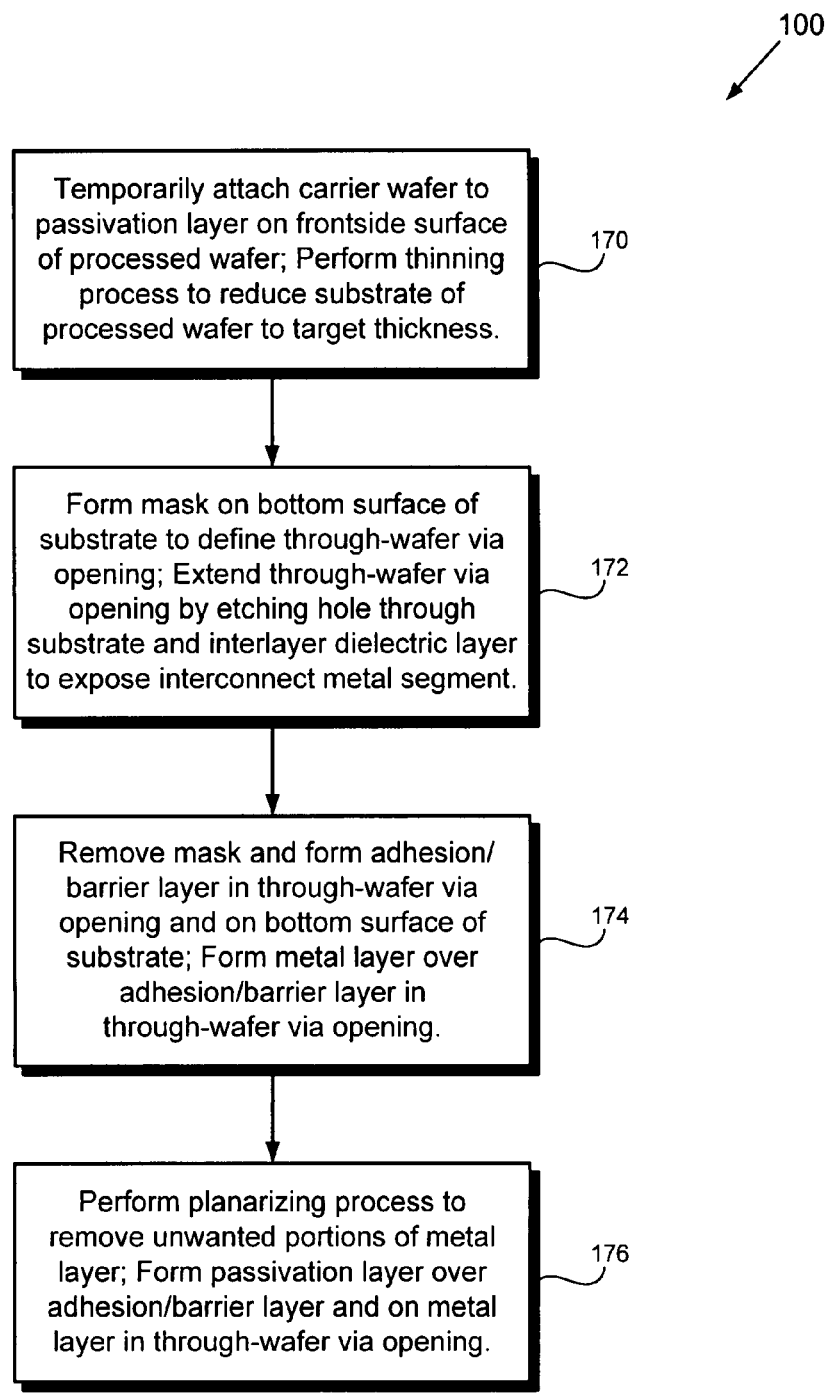
FIG. 1 shows a flowchart illustrating the steps taken to implement an embodiment of the present invention.

FIG. 1 shows a flow chart illustrating an exemplary method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 176 indicated in flowchart 100 are sufficient to describe one embodiment of the present invention; however, other embodiments of the invention may utilize steps different from those shown in flowchart 100. It is noted that the processing steps shown in flowchart 100 are performed on a portion of a processed wafer, which, prior to step 170, includes, among other things, a passivation layer, a silicon substrate, multiple interlayer dielectric layers and interconnect metal layers, and one or more semiconductor devices, which can include, for example, BJTs and/or CMOS transistors (e.g. N-channel FETs and P-channel FETs). The processed wafer may also be referred to simply as a wafer or a semiconductor die or simply a die in the present application.

Moreover, structures 270 through 276 in FIGS. 2A through 2D illustrate the result of performing steps 170 through 176 of flowchart 100, respectively. For example, structure 270 shows a semiconductor structure after processing step 170, structure 272 shows structure 270 after the processing of step 172, structure 274 shows structure 272 after the processing of step 174, and so forth.

Referring now to FIG. 2A, structure 270 of FIG. 2A shows an exemplary structure including a substrate, after completion of step 170 of flowchart 100 in FIG. 1. In structure 270, interlayer dielectric layer 206 is situated over substrate 202, interconnect metal layer 208 is situated over interlayer dielectric layer 206, interlayer dielectric layer 210 is situated over interconnect metal layer 208, interconnect metal layer 212 is situated over interlayer dielectric layer 210, interlayer dielectric layer 214 is situated over interconnect metal layer 212, and interconnect metal layer 216 is situated over interlayer dielectric layer 214. Each of interlayer dielectric layers 206, 210, and 214 can comprise silicon oxide or other suitable dielectric material and can be formed by utilizing a chemical vapor deposition (CVD) process or other suitable deposition processes. Substrate 202 can be a silicon substrate and can have a thickness of, for example, approximately 725.0 microns in an eight inch diameter silicon wafer prior to performance of step 170 of flowchart 100.

Interconnect metal layers 208, 212, and 216 can be respective first (i.e. M1), second (i.e. M2), and third (i.e. M3) interconnect metal layers in the processed wafer and can each comprise copper, aluminum, or other suitable metal. Also in structure 270, interconnect metal segments 218, 220, and 222 are situated in respective interconnect metal layers 208, 212, and 216. Interconnect metal segments 218, 220, and 222 can provide ground connections for respective interconnect metal layers 208, 212, and 216. Further in structure 270, interconnect metal segment 220 is connected to interconnect metal segment 218 by vias 224, which are situated in interlayer dielectric layer 210, and interconnect metal segment 222 is connected to interconnect metal segment 220 by vias 226, which are situated in interlayer dielectric layer 214. Vias 224 and 226, which are conventional vias, can comprise tungsten, copper, aluminum, or other suitable metal and can be formed in respective interlayer dielectric layers 210 and 214 in a manner as known in the art.

Also in structure 270, interlayer dielectric layer 228 is situated over interconnect metal layer 216 and interconnect metal layer 230 is situated over interlayer dielectric layer 228. Interlayer dielectric layer 228 can comprise silicon oxide or other suitable dielectric material and can be formed by using a CVD process or other suitable deposition processes. Interconnect metal layer 230 can be a fourth (i.e. M4) interconnect metal layer in the processed wafer, can comprise copper, aluminum, or other suitable metal, and can be formed in a manner known in the art. Interconnect metal layer 230 can have a thickness of between 0.5 microns and 10.0 microns, for example.

Further in structure 270, bond pad 232 and interconnect metal segment 234 are situated over interlayer dielectric layer 228 in interconnect metal layer 230. Bond pad 232 can be, for example, a signal bond pad, and can be coupled by an interconnect structure (not shown in FIG. 2A) to a semiconductor device (not shown in FIG. 2A) on the processed wafer. In the present embodiment, interconnect metal segments 234, 222, 220, and 218 along with electrically connected interconnecting vias 236, 226, and 224 form through wafer via landing pad 235. Through-wafer via landing pad 235 can be a ground connection in interconnect metal layer 230. In other embodiments, through-wafer via landing pad 235 may comprise fewer metal segments. For example, through wafer via landing pad 235 may comprise metal segment 208 only. In another example, through wafer via landing pad 235 may comprise metal segment 234 only. In another example, through wafer via landing pad 235 may comprise metal segments 218 and 220 and interconnecting vias 224.

Also in structure 270, passivation layer 240 is situated on interconnect metal segment 234, bond pad 232, and top surface 244 of interlayer dielectric layer 228. Passivation layer 240 can comprise, for example, a layer of silicon nitride situated on a layer of silicon oxide. In other embodiments, passivation layer 240 can comprise one or more suitable dielectric materials. Passivation layer 240 can be formed by utilizing a CVD process or other suitable deposition processes to deposit a layer of silicon oxide over interlayer dielectric layer 228, interconnect metal segment 234, and bond pad 232, and depositing a layer of silicon nitride on the layer of silicon oxide. Passivation layer 240 can comprise of additional layer of polyimide for planarizing the top surface of the wafer and can be formed by spin coating and baking In structure 270, the frontside surface of the processed wafer (hereinafter "frontside surface 238") refers to the top surface of the processed wafer after passivation layer 240 has been formed over bond pad 232, interconnect metal segment 234, and interlayer dielectric layer 228. Thus, frontside surface 238 includes the top surface of passivation layer 240. In structure 270, bottom surface 242 of substrate 202 also refers to the bottom surface of the processed wafer.

In the present embodiment, the processed wafer includes four interlayer dielectric layers (e.g. interlayer dielectric layers 206, 210, 214, and 228) and four interconnect metal layers (e.g. interconnect metal layers 208, 212, 216, and 230). In other embodiments, the processed wafer can includes more or less than four interlayer dielectric layers and more or less than four interconnect metal layers. It is noted that only interconnect metal segments 218, 220, 222, and 234 and vias 224, 226, and 236 are specifically discussed herein to preserve brevity.

Referring now to step 170 in FIG. 1 and structure 270 in FIG. 2A, at step 170 of flowchart 100, carrier wafer 247 is temporarily attached to frontside surface 238 of the processed wafer. Carrier wafer 247 supports the subsequently thinned wafer during backside processing. Carrier wafer 247 can comprise silicon, sapphire or glass and can be perforated or nonperforated, the latter enabling easier debond techniques. The processed wafer is mounted to carrier wafer by temporary adhesive layer 246, which can be laminated thermal adhesive film, ultraviolet curable film, or other suitable temporary bonding material. A thinning process can be performed to reduce substrate 202 to target thickness 203 by utilizing a coarse backgrinding process to remove a sufficient amount of silicon material from substrate 202 of the processed wafer. For example, the coarse backgrinding process can reduce substrate 202 from an initial thickness of up to approximately 725.0 microns for eight inch silicon wafer to target thickness 203, which can be between 25.0 microns and 400.0 microns.

In another embodiment, a protective coating layer is situated over passivation layer 240 and is utilized to protect frontside surface 238 (i.e. the frontside surface of the processed wafer) and devices (not shown in FIG. 2A) during backside processing. The protective coating layer can comprise a thick resist, such as polymethylmethacrylate (PMMA) or polymethylglutarimide (PMGI), or polyimide, which can be formed by spin coating and baking. The carrier wafer may not be used and the protective coating layer prevents damage to the frontside of the wafer during subsequent processing steps on the backside of the wafer.

A substrate damage removal process can be performed after the thinning process from the backside of the processed wafer to remove substrate surface damage caused by the coarse backgrinding process, such as microcracks in bottom surface 242 of substrate 202. The substrate damage removal process can include a soft grinding process, a soft chemical mechanical polishing (CMP) process, and/or an etch process, such as a suitable dry or wet etch process. In one embodiment, substrate 202 can be reduced to target thickness 203 by performing a thinning process prior to temporarily bonding carrier wafer 247 to the processed wafer. The result of step 170 of flowchart 100 is illustrated by structure 270 in FIG. 2A.

Figure 2B:
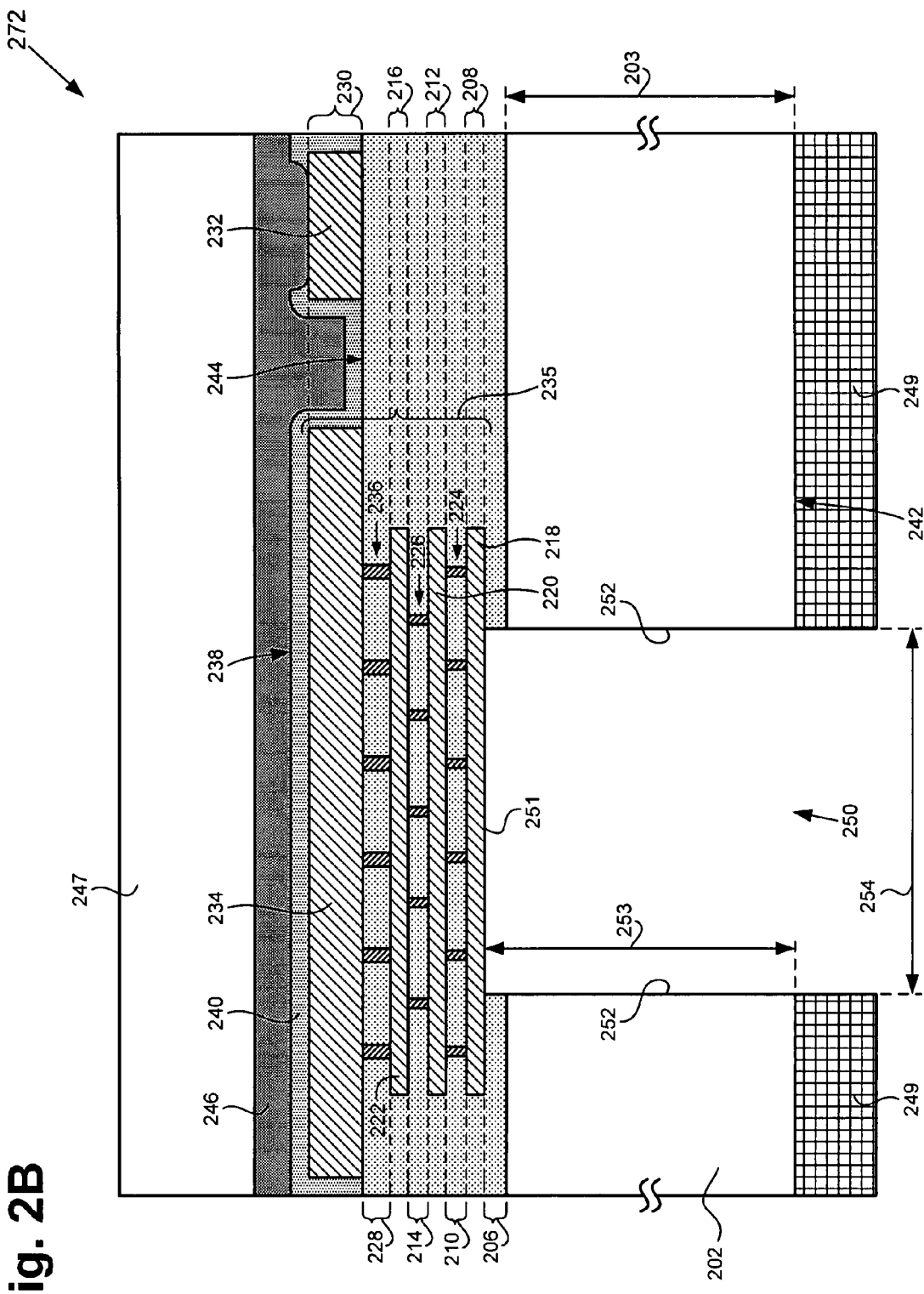
FIG. 2B illustrates a cross-sectional view, which includes a portion of a wafer processed according to an embodiment of the invention, corresponding to an intermediate step in the flowchart in FIG. 1.

Referring to step 172 in FIG. 1 and structure 272 in FIG. 2B, at step 172 of flowchart 100, mask 249 is formed on bottom surface 242 of substrate 202 to define through-wafer via opening 250 and through-wafer via opening 250 is extended by etching a hole through substrate 202 and interlayer dielectric layers 206, 210, 214, and 228 to expose bottom surface 251 of through-wafer via landing pad 235. Mask 249 is situated on bottom surface 242 of substrate 202 and can comprise photoresist or a suitable hard mask material patterned with photoresist. The hard mask material may comprise a thin metal film comprising titanium-tungsten (TiW), tantalum (Ta), tantalum nitride (TaN), titanium (Ti), titanium nitride (TiN), aluminum, or other suitable metallic material. The hard mask may also comprise a dielectric material such as silicon oxide or silicon nitride, for example. Mask 249 can be formed by depositing and patterning a layer of masking material such as photoresist and alignment techniques in a manner known in the art. Through-wafer via opening 250, which is defined by mask 249, is situated in substrate 202 and interlayer dielectric layer 206 and has sidewalls 252 and a bottom surface, which is formed by bottom surface 251 of interconnect metal segment 218. Through-wafer via opening 250 has depth 253, which corresponds to the distance between bottom surface 242 of substrate 202 and bottom surface 251 of through-wafer via opening 250, and width 254. For example, depth 253 can be greater than 25.0 microns. For example, width 254 of through-wafer via opening 250 can be between 4.0 microns and 100.0 microns.

Through-wafer via opening 250 can be extended through substrate 202 by utilizing an anisotropic deep reactive-ion etching (DRIE) process, for example. In the DRIE process, such as a DRIE process based on the Bosch process, sequential repetitions of an etch step and polymer-deposition step can be utilized to achieve a high silicon etch rate with an anisotropic profile (i.e. substantially vertical sidewalls). A sulfur hexafluoride ($SF_6$) etchant can be utilized to etch silicon in the etch step of the DRIE process, for example. In the polymer-deposition step, for example, a fluorocarbon (i.e. CxFy) based etchant can be utilized to deposit a fluorocarbon polymer film on sidewalls 252 of through-wafer via opening 250 to provide protection from undesirable lateral etching. In another embodiment, an etching process other than a Bosch DRIE process can be used to obtain tapered (non vertical) sidewalls. The etchant gases for such process may comprise chlorine and hydrogen bromide (HBr).

In one embodiment, through-wafer via opening 250 can be extended through substrate 202 by utilizing an anisotropic wet etch process, which can include a wet etchant such as potassium hydroxide (KOH), ethylene diamine pyrocatechol (EDP), or tetra-methyl ammonium hydroxide (TMAH), for example. By way of background, in a silicon anisotropic wet etch process, the silicon etch rate can be appropriately controlled to achieve an etched silicon opening having smooth, sloped sidewalls. By utilizing an anisotropic wet etch process to cause through-wafer via opening 250 to have smooth, sloped sidewalls in substrate 202, subsequent deposition of an adhesion/barrier layer in through-wafer via opening 250 can be advantageously facilitated. The crystallographic plane for the frontside and backside of the silicon wafer is <100>. Anisotropic wet etchants etch preferentially in the <100> plane, producing a characteristic anisotropic etch profile with sidewalls that form a 54.7 degree angle with the surface. The anisotropic etch is also very selective to the interlayer dielectric layer exposed at the bottom of the via opening.

Through-wafer via opening 250 can then be extended through interlayer dielectric layer 206 by utilizing a suitable anisotropic dry etch process, or a wet etch process, to sequentially remove oxide material in interlayer dielectric layer 206. In the present embodiment, the dry etch process stops on bottom surface 251 of interconnect metal segment 218, which is situated in interconnect metal layer 208 (i.e. M1). In other embodiments, through-wafer via 250 can be extended through two or more interlayer dielectric layers such that the dry etch process stops on a respective interconnect metal segment in interconnect metal layer 212 (i.e. M2) or interconnect metal layer 216 (i.e. M3), or interconnect metal layer 230 (i.e. M4). The result of step 172 of flowchart 100 is illustrated by structure 272 in FIG. 2B.

Figure 2C:
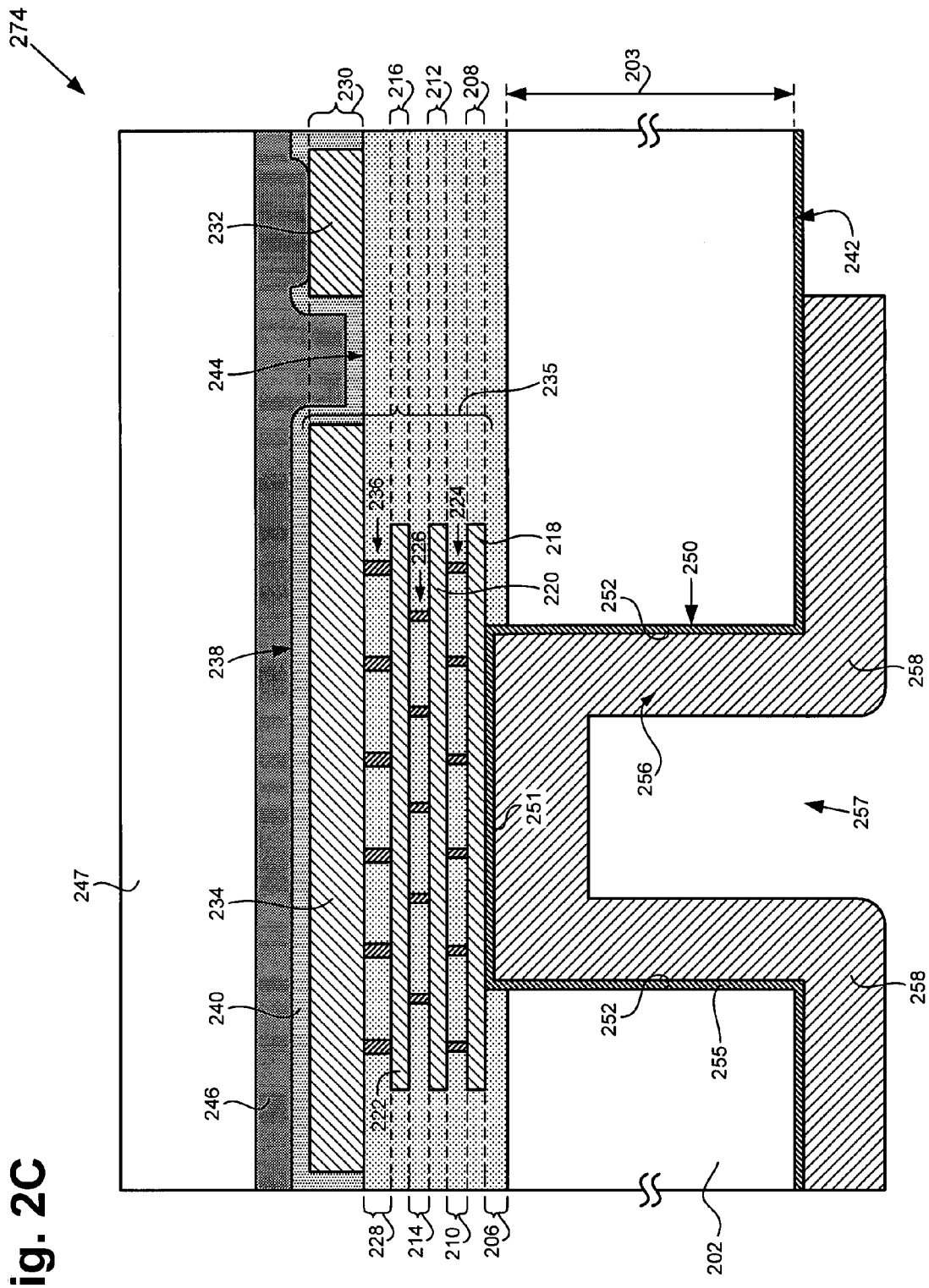
FIG. 2C illustrates a cross-sectional view, which includes a portion of a wafer processed according to an embodiment of the invention, corresponding to an intermediate step in the flowchart in FIG. 1.

Referring to step 174 in FIG. 1 and structure 274 in FIG. 2C, at step 174 of flowchart 100, mask 249 (shown in FIG. 2B) is removed, adhesion/barrier layer 255 is formed in through-wafer via opening 250 and on bottom surface 242 of substrate 202, and metal layer 256 is formed on adhesion/barrier layer 255 in through-wafer via opening 250. Mask 249 (shown in FIG. 2B) can be removed from bottom surface 242 of substrate 202 by utilizing a dry strip process and/or a wet strip process. After removal of mask 249 (shown in FIG. 2B), a clean process can be performed to remove any unwanted material, such as native oxide, on sidewalls 252 of through-wafer via opening 250 and on bottom surface 242 of substrate 202. The cleaning process can be a wet clean process or an argon (Ar) presputter clean process, for example, which can be performed in a manner known in the art.

Adhesion/barrier layer 255 is situated on sidewalls 252 of through-wafer via opening 250, on bottom surface 251 in through-wafer via opening 250, and on bottom surface 242 of substrate 202. Adhesion/barrier layer 255 can comprise titanium-tungsten (TiW), tantalum/tantalum nitride (Ta/TaN), titanium/titanium nitride (Ti/TiN), tungsten (W), a combination of these layers, for example, or other suitable metallic material. Adhesion/barrier layer 255 can be formed by utilizing a physical vapor deposition (PVD) process, a CVD process, or other suitable deposition process. Metal layer 256 is situated over adhesion/barrier layer 255 in through-wafer via opening 250 and can comprise copper. In other embodiments, metal layer 256 can comprise aluminum, gold or other suitable metal or metal stack. In the present embodiment, metal layer 256 extends over bottom surface 242 of substrate 202. In one embodiment, metal layer 256 does not extend over bottom surface 242 of substrate 202. In the present embodiment, metal layer 256 does not completely fill through-wafer via opening 250. In other embodiments, metal layer 256 can completely fill through-wafer via opening 250.

Metal layer 256 can be formed by first depositing a seed layer (not shown in FIG. 2C) comprising copper, gold or other suitable metal which will be subsequently electroplated, on adhesion/barrier layer 255 by using a PVD process, a CVD process, or other suitable deposition process. In the present embodiment, a copper seed layer can be deposited and a copper electrochemical deposition (ECD) mask (not shown in FIG. 2C) can then be formed over bottom surface 242 of substrate 202. The ECD mask is used to prevent electrochemical deposition of a thick layer of copper in the dicing street regions as well as other regions for stress relief. Next, a thick layer of copper can be conformally deposited over an unmasked portion of the seed layer (not shown in FIG. 2C) and adhesion/barrier layer 255 situated in through-wafer via opening 250 by utilizing an electrochemical plating process or other suitable deposition processes. After metal layer 256 has been deposited, the ECD mask (not shown in FIG. 2C) can be removed by utilizing a wet strip process or other suitable etch process. Metal layer 256 can include portions 258, which extend below bottom surface 242 of substrate 202.

In one embodiment, the ECD masking step is skipped and metal layer 256 can be deposited in through-wafer via opening 250 by a bottom up plating process such that portions 258 are not formed. In another embodiment, the ECD masking step is skipped and the copper is conformally deposited by ECD within the through-wafer via and the entire backside surface of the wafer. In the present embodiment, a copper anneal process can then be performed in a manner known in the art. In another embodiment, a copper anneal process may not be performed.

Thus, as shown in FIG. 2C, through-wafer via 257, which is also referred to as a "backside through-wafer via" in the present application, includes through-wafer via opening 250, the portion of adhesion/barrier layer 255 situated in through-wafer via opening 250, and metal layer 256. The result of step 174 of flowchart 100 is illustrated by structure 274 in FIG. 2C.

Figure 2D:
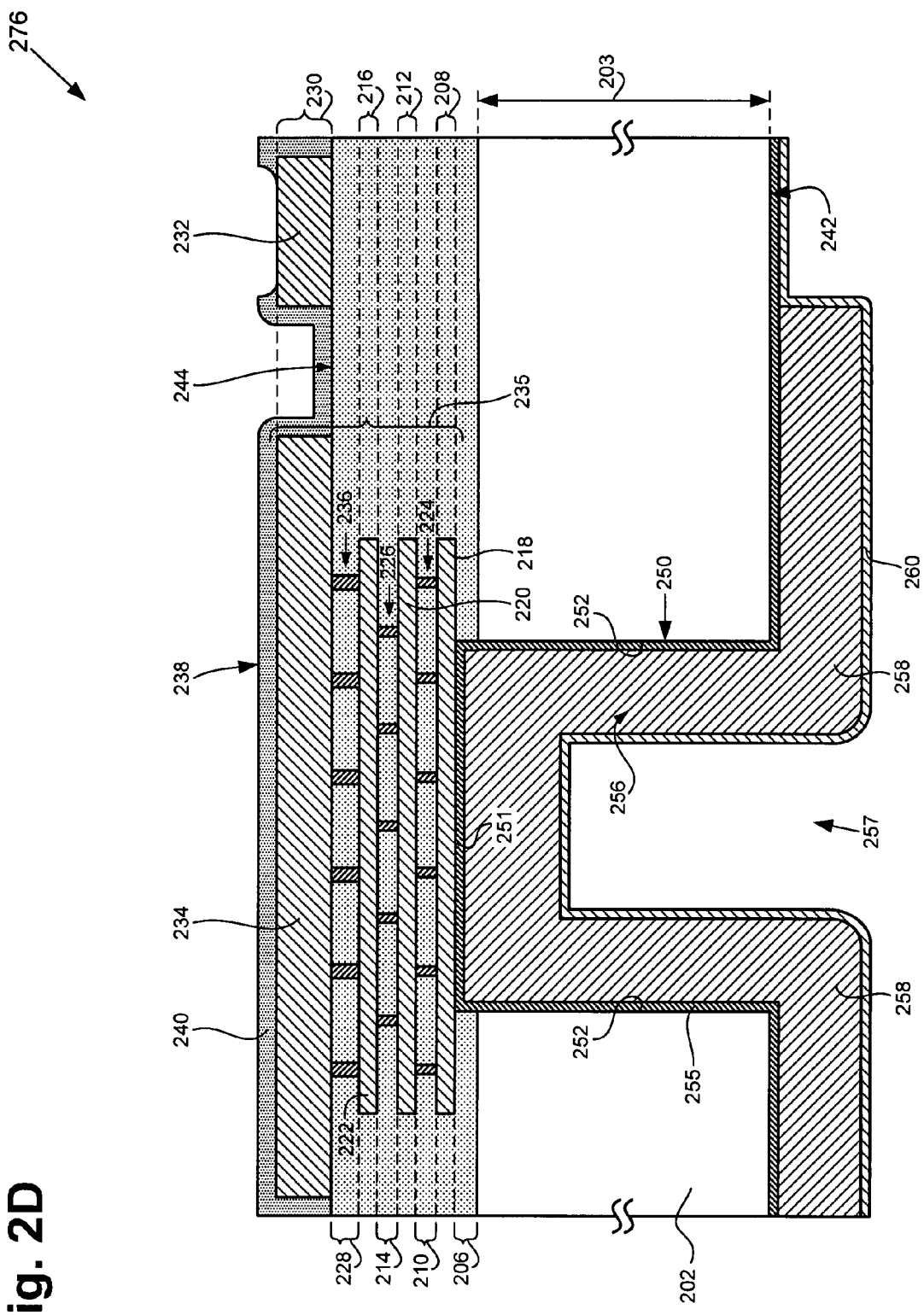
FIG. 2D illustrates a cross-sectional view, which includes a portion of a wafer processed according to an embodiment of the invention, corresponding to a final step in the flowchart in FIG. 1.

Referring to step 176 in FIG. 1 and structure 276 in FIG. 2D, at step 176 of flowchart 100, a planarizing process is performed to remove unwanted portions of metal layer 256 and protective layer 258 is formed over adhesion/barrier layer 242 and on metal layer 256 situated in through-wafer via opening 250. The unwanted portions of metal layer 256, can be removed by performing a planarizing process, such as a copper chemical mechanical polishing (CMP) process. A planarizing process may not be performed in one embodiment of the present invention. After the copper CMP process has been performed, a suitable cleaning process can be performed to remove unwanted residue resulting from the copper CMP process.

Electrically conductive backside passivation layer 260 (also simply referred to as "electrically conductive passivation layer 260") is situated on metal layer 256 to prevent metal layer 256 from oxidizing as well as for the die to be bonded to the package substrate. Electrically conductive passivation layer 260 can comprise nickel/gold (Ni/Au), nickel/silver (Ni/Ag) or other suitable metal stack or suitable metal. Electrically conductive backside passivation layer 260 can be formed by utilizing an electroless plating process or other suitable deposition process. After formation of electrically conductive passivation layer 260, carrier wafer 247 (shown in FIG. 2C) can be removed in a manner known in the art. After removal of carrier wafer 247 (shown in FIG. 2C), temporary adhesive layer 246 (shown in FIG. 2C) can be removed by utilizing a suitable etch process. The result of step 176 of flowchart 100 is illustrated by structure 276 in FIG. 2D.

In the present embodiment, through-wafer via 257 provides a large-size, conductive structure that extends through substrate 202 and interlayer dielectric layer 206 and is in electrical contact with interconnect metal segments 218, 220, 222, and 234, substrate 202, and electrically conductive passivation layer 260. Also, through-wafer via landing pad 235 is electrically connected to ground in interconnect metal layer 230, 216, 212, and/or 238. Thus, through-wafer via 257 advantageously provides an effective, low impedance ground conduit for silicon-based semiconductor devices that are fabricated on the processed wafer. Additionally, since through-wafer via 257 extends through the processed wafer and includes metal layer 256, through-wafer via 257 also advantageously provides an efficient thermal conduit for transferring heat away from the silicon-based semiconductor devices that are fabricated on the processed wafer.

Thus, as discussed above, in the embodiment of FIGS. 1 and 2A through 2D, the invention achieves a backside through-wafer via that extends through a processed wafer and is in electrical contact with a silicon substrate to advantageously provide a low-resistance ground conduit and an effective thermal conduit for semiconductor devices fabricated on the processed wafer. It is understood to those of ordinary skill in the art that although the invention has been described in reference to a "wafer" or a "processed wafer," such wafer can be diced and singulated into individual dies and thereafter packaged using various semiconductor packaging techniques and processes. As such, the invention is manifestly applicable to fabricating wafers and/or dies, which may or may not be later packaged, in accordance with the teachings of the invention as described above.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method for fabricating a backside through-wafer via in a processed wafer and related structure have been described.

The invention claimed is:

1. A method for fabricating a backside through-wafer via in a processed wafer, said processed wafer including a substrate, at least one interlayer dielectric layer situated over said substrate, and at least one interconnect metal segment situated over said at least one interlayer dielectric layer, said method comprising steps of:

forming a through-wafer via opening through said substrate from a backside of said substrate;

extending said through-wafer via opening through said at least one interlayer dielectric layer after said at least one interlayer dielectric layer has been formed and stopping on a bottom surface of said at least one interconnect metal segment;

forming a metal layer conformally in said through-wafer via opening, said metal layer not completely filling said through-wafer via opening;

wherein said metal layer in said through-wafer via opening forms an electrical connection to said substrate, and wherein said metal layer is in electrical contact with said at least one interconnect metal segment; and wherein said metal layer is in electrical contact with a bond pad, said bond pad capable of being in electrical contact with at least one device not formed in said substrate.

2. The method of claim 1 further comprising a step of performing a thinning process to reduce said substrate to a target thickness prior to said step of forming said through-wafer via opening.

3. The method of claim 1 further a step of forming an adhesion/barrier layer in said through-wafer via and on a bottom surface of said substrate prior to said step of forming said metal layer.

4. The method of claim of 1 further comprising a step of forming an electrically conductive passivation layer on said metal layer and over a bottom surface of said substrate, wherein said electrically conductive passivation layer is in electrical contact with said metal layer and said substrate.

5. The method of claim 1, wherein said step of forming said through-wafer via opening through said substrate comprises utilizing an anisotropic deep reactive-ion etching process.

6. The method of claim 1, wherein said step of forming said through-wafer via opening through said substrate comprises utilizing an anisotropic wet etch process.

7. The method of claim 1, wherein said through-wafer via opening has a width of between 4.0 microns and 100.0 microns.

8. The method of claim 1, wherein said metal layer is electrically connected to a through-wafer via landing pad situated over said at least one interlayer dielectric layer.

9. The method of claim 1 further comprising dicing said processed wafer into a plurality of dies.

10. A semiconductor die comprising at least one backside through-wafer via, said semiconductor die including at least one interlayer dielectric layer overlying a substrate and including at least one interconnect metal segment, said at least one backside through-wafer via comprising:
- a through-wafer via opening extending through said substrate and said at least one interlayer dielectric layer after said at least one interlayer dielectric layer has been formed and stopping on a bottom surface of said at least one interconnect metal segment;
- a metal layer con formally formed on and situated in but not completely filling said through-wafer via opening and under said at least one interconnect metal segment, said at least one interconnect metal segment being situated over said at least one interlayer dielectric layer;
- wherein said metal layer in said through-wafer via opening is in electrical contact with said substrate and said at least one interconnect metal segment; and
- wherein said metal layer is in electrical contact with a bond pad, said bond pad capable of being in electrical contact with at least one device not formed in said substrate.

11. The semiconductor die of claim 10, wherein said metal layer is in electrical contact with an electrically conductive passivation layer situated over a bottom surface of said substrate.

12. The semiconductor die of claim 10, wherein said at least one backside through-wafer via further comprises an adhesion/barrier layer, wherein said metal layer is situated on said adhesion/barrier layer in said through-wafer via opening.

13. The semiconductor die of claim 10, wherein said metal layer is electrically connected to a through-wafer via landing pad situated over said at least one interlayer dielectric layer.

14. The semiconductor die of claim 10, wherein said through-wafer via opening has a width of between 4.0 microns and 100.0 microns.

15. The semiconductor die of claim 10, wherein said metal layer comprises metal selected from the group consisting of copper, aluminum, and tungsten.

16. The semiconductor die of claim 10, wherein said semiconductor die is enclosed in a semiconductor package.

17. The semiconductor die of claim 10, wherein said substrate comprises silicon.

18. The semiconductor die of claim 10, wherein said substrate comprises gallium arsenide.

\* \* \* \* \*